United States Patent
Maayan

(10) Patent No.: US 8,971,129 B2
(45) Date of Patent: Mar. 3, 2015

(54) NROM DEVICE WITH REDUCED POWER UNIT

(71) Applicant: Spansion Israel Ltd., Netanya (IL)

(72) Inventor: Eduardo Maayan, Kfar Saba (IL)

(73) Assignee: Spansion Israel Ltd, Netanya (IL)

( * ) Notice: Subject to any disclaimer, the term of this patent is extended or adjusted under 35 U.S.C. 154(b) by 0 days.

(21) Appl. No.: 13/845,739

(22) Filed: Mar. 18, 2013

(65) Prior Publication Data

US 2013/0223144 A1 Aug. 29, 2013

Related U.S. Application Data

(62) Division of application No. 11/153,738, filed on Jun. 15, 2005, now Pat. No. 8,400,841.

(51) Int. Cl.
| | |
|---|---|
| *G11C 16/04* | (2006.01) |
| *G11C 16/10* | (2006.01) |
| *G11C 11/56* | (2006.01) |
| *G11C 16/30* | (2006.01) |

(52) U.S. Cl.
CPC ............ *G11C 16/10* (2013.01); *G11C 11/5671* (2013.01); *G11C 16/0475* (2013.01); *G11C 16/0491* (2013.01); *G11C 16/30* (2013.01)

USPC ............ 365/185.28; 365/185.18; 365/185.01; 365/185.03; 365/185.07; 365/185.08

(58) Field of Classification Search
USPC ............. 365/185.28, 185.18, 185.01, 185.03, 365/185.07, 185.08
See application file for complete search history.

(56) References Cited

U.S. PATENT DOCUMENTS

| | | | | |
|---|---|---|---|---|
| 6,201,737 | B1 * | 3/2001 | Hollmer et al. .......... | 365/185.16 |
| 6,226,214 | B1 * | 5/2001 | Choi ........................ | 365/230.03 |
| 7,023,728 | B2 * | 4/2006 | Pascucci .................. | 365/185.01 |
| 7,221,587 | B2 * | 5/2007 | Yamashita et al. ....... | 365/185.12 |
| 7,800,948 | B2 * | 9/2010 | Ueda ........................ | 365/185.18 |
| 2005/0232024 | A1 * | 10/2005 | Atir et al. ................. | 365/189.04 |
| 2007/0014142 | A1 * | 1/2007 | Ng et al. ................... | 365/94 |

* cited by examiner

*Primary Examiner* — Connie Yoha
(74) *Attorney, Agent, or Firm* — Eitan, Mehulal & Sadot

(57) ABSTRACT

A method includes minimizing current leaking through a virtual ground pipe during access of NROM memory cells. The minimizing includes operating two neighboring memory cells generally together, which includes connecting an operation voltage to a shared local bit line of the two neighboring memory cells and connecting the external local bit lines of two neighboring memory cells to a receiving unit, such as a ground supply or two sense amplifiers. Also included is an array performing the method.

11 Claims, 5 Drawing Sheets

NROM DEVICE WITH REDUCED POWER UNIT

CROSS-REFERENCE TO RELATED APPLICATIONS

This application is a divisional application claiming benefit from U.S. patent application Ser. No. 11/153,738 filed 15 Jun. 2005 which is hereby incorporated in its entirety by reference.

FIELD OF THE INVENTION

The present invention relates to NROM arrays generally and to their programming in particular.

BACKGROUND OF THE INVENTION

Charge trapping, non-volatile memory cells are known in the art. Nitride read only memory (NROM) cells are based on a charge trapping material that is capable of storing one or more bits of data within a single cell. A typical use of NROM devices is to store at least two bits of data within one cell, where the bits are stored in physically separated charge storage areas, one on either side of the cell. Each storage area can be operated in a single-level or in a multi-level mode.

The cells are typically formed into memory arrays, formed of rows and columns of memory cells electrically connected to word lines (e.g. rows of the array) and bit lines (columns). Reference is now made to FIG. 1, which illustrates a typical example of a row of a prior art array of NROM cells.

In this row, as in the other rows of the array, each memory cell 10 is connected to a word line WL and to two local bit lines LBL(j), where each local bit line serves two neighboring columns. To program a cell, for example, cell 10A, a high voltage (VWL) is provided on word line WL, to activate the row of cells. A programming voltage (VP) is provided on one of the local bit lines, for example LBL3, surrounding cell 10A and a close to ground voltage (GND) is provided on the other local bit line, such as LBL4. The remaining local bit lines in the vicinity of cell 10A are maintained floating. Due to the combination of high voltage VWL at its gate G and programming voltage VP at its drain D, the left side storage area of cell 10A will become programmed.

During such a programming operation, the floating local bit lines near local bit line LBL3 also charge up. Cells 10B and 10C act as transfer devices, transferring charge to local bit lines LBL2 and LBL1 which, in turn, charge up, and their voltages follow that of LBL3. The longer the programming pulse is, the more the floating local bit lines will be charged up. This charging current flowing through the memory cells in the vicinity of the cell being programmed is sometimes referred as a "leak current" ($I_{leak}$) or as the "Virtual Ground pipe current" ($I_{VGpipe}$). This pipe current does not cause programming of the cells in the pipe due to the low drain-source voltage across those cells. However, very unfortunately, this unnecessary charging of local bit lines is not required for programming cell 10A and wastes unnecessary power. Furthermore, since $I_{VGpipe}$ is driven from the bit line voltage supply (VP), which is typically generated by a charge pump, and since the charge pump efficiency is relatively low, the power penalty caused by $I_{VGpipe}$ is very significant.

A similar "pipe effect" occurs on the other side of cell 10A, i.e. the floating local bit lines LBL5, LBL6, etc., also follow local bit line LBL4. However, since local bit line LBL4 is driven to a close to ground level, these local bit lines are not significantly charged and thus, the virtual ground pipe effect generally refers only to the virtual ground pipe at the high voltage side.

To reduce the charging current $I_{VGpipe}$, the virtual ground pipe may be shortened via isolation columns 12 which may "slice" the rows of the array into slices having a pre-defined number of columns. Isolation columns 12 stop the propagation of the charging current $I_{VGpipe}$, and reduce the amount of capacitance (of the local bit lines) unnecessarily charged during a programming pulse. Of course, such slicing increases the total die area due to the additional isolation columns 12.

An additional method to minimize $I_{VGpipe}$ is to reduce the capacitance of the local bit lines by segmenting them. In this method, the virtual ground array is segmented into multiple physical sectors (one of which is shown in FIG. 2, to which reference is now made), which can be separately activated.

The architecture of FIG. 2 also includes global bit lines (GBLs), which enable access to memory cells of different physical sectors. Select transistors 14 connect selected physical sectors to the global bit lines. Groups of select transistors 14 are activated by select lines SELk. Typically, the select transistors 14 of a group are spread apart in the array.

In the specific array configuration shown in FIG. 2, one set of select transistors 14 connects to the even-numbered local bit lines, at one end of the local bit lines, while another set of transistors connects to the odd-numbered local bit lines, at a second end of the local bit lines. When programming a bit of a memory cell, for example, the right storage area of memory cell 11, its word line, such as WL(i), is activated by an X decoder 16, power is provided, by a Y unit 18, on global bit line GBL(N) and Y unit 18 connects global bit line GBL(N+1) to ground. Y unit 18 typically may also decode the address of memory cell 11 and from the result, may activate the selected global bit lines GBL and may instruct XDEC 16 as to which select transistors SEL to activate.

Select lines SEL4 and SEL5 are activated respectively to connect global bit line GBL(N+1) to LBLa and LBLb to global bit line GBL(N). Thus, as shown with the arrows, programming current $I_{pgm}$ flows from global bit line GBL(N), through select transistor SEL5 to local bit line LBLb, through activated memory cell 11, to local bit line LBLa, to select transistor SEL4 and, from there, to global bit line GBL(N+1) connected to ground. Of course, while applying a programming pulse to the right storage area of cell 11, the local bit lines to the right of LBLb, i.e. the virtual ground pipe to the right of cell 11, are charged, unnecessarily wasting power.

While the virtual ground array segmentation of FIG. 2 may reduce local bit line capacitance and thus, the power waste, it requires select transistors (for segmentation) and therefore has a significant die area penalty.

Usually, when programming a non-volatile memory array, more than a single cell is programmed at a time. The number of cells being programmed in parallel typically depends on the device specifications (e.g. programming rate, current consumption, etc.). In general, the cells being programmed in parallel share the same word line and the same physical sector, and are typically located in different virtual ground slices. Each of the cells being programmed in parallel suffers from the virtual ground pipe effect, and therefore, the larger the number of cells being programmed, the larger the wasted power is.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
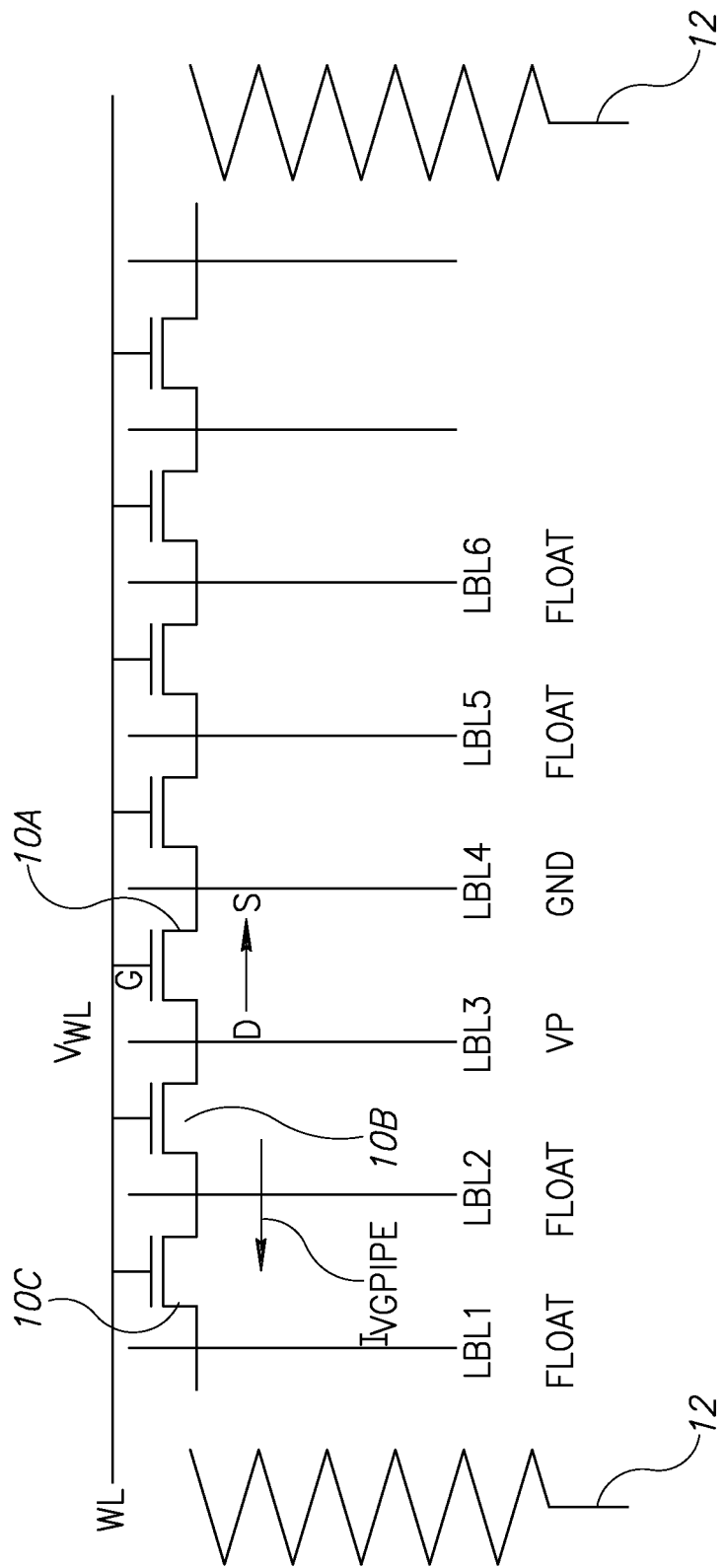
FIG. 1 is a circuit diagram illustration of a row of a prior art, virtual ground array.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that power may be saved by accessing two neighboring storage areas of two different NROM (nitride read only memory) cells, those that sit on either side of one local bit line, at generally the same time. Since such neighboring storage areas sit on the same local bit line, only one global bit line (the shared one) may need to be driven high, a further saving over the prior art which drove high one global bit line per cell to be accessed.

Applicant has further realized that the two storage areas are in two different cells and, to access the two neighboring storage areas, two global bit lines, those connected to the "external" local bit lines of the two cells, may be connected to ground. As a result, none of the neighboring local bit lines to the local bit line driven high may be left floating, and as a result, there may be no charging of current pipe $I_{VGpipe}$. This may save significant amounts of power.

Figure 2:
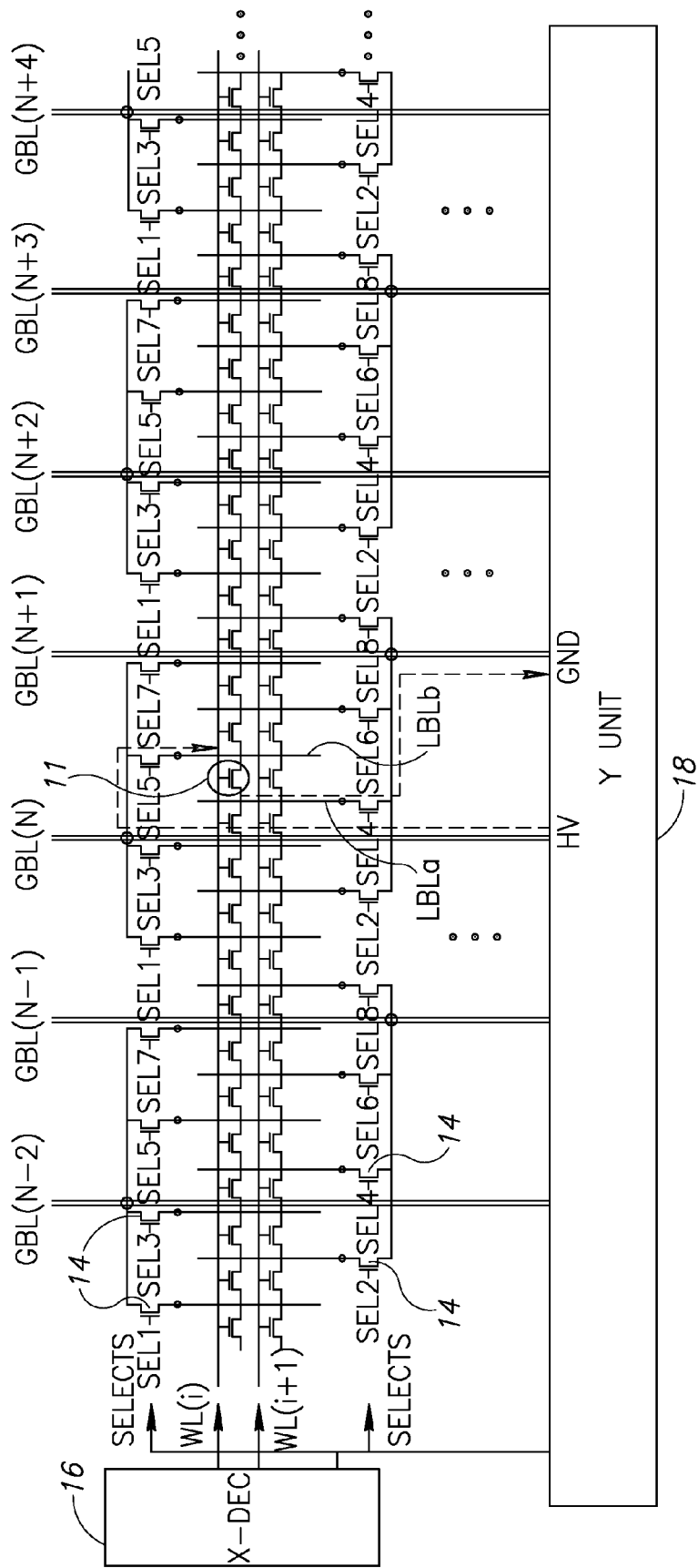
FIG. 2 is a circuit diagram illustration of a prior art, virtual ground array.
Figure 3:
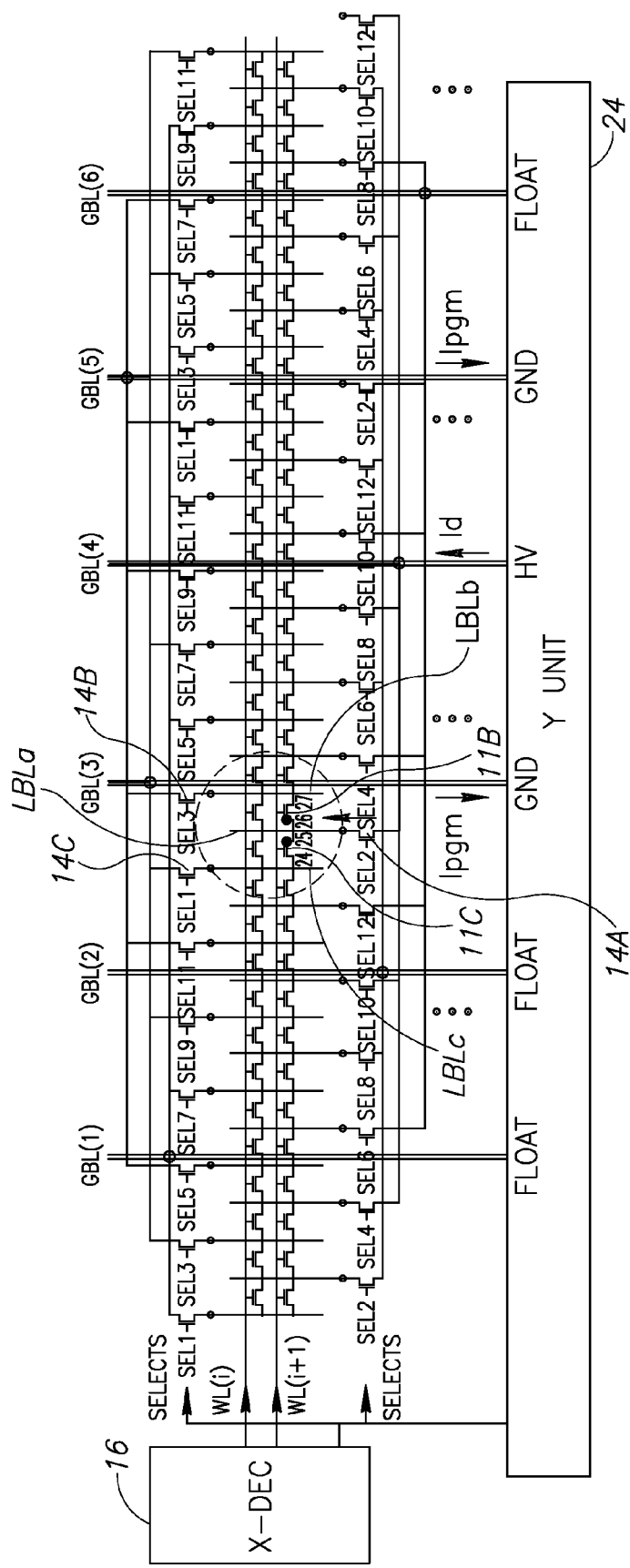
FIG. 3 is a circuit diagram illustration of a virtual ground array, constructed and operative in accordance with the present invention.

Reference is now made to FIG. 3, which illustrates an architecture for programming two neighboring storage areas at generally the same time. The architecture may be similar to that of FIG. 2, and thus, may include word lines WL(i), local bit lines LBL(j), global bit lines GBL, select lines SELk and X decoder 16. However, in accordance with a preferred embodiment of the present invention, there may also be a Y unit 24 which may enable two neighboring storage areas on the same local bit lines, such as storage areas 25 and 26, to be programmed at generally the same time. It is noted that the neighboring storage areas are stored in neighboring memory cells, here labeled cells 11B and 11C. It is further noted that, in the embodiment of FIG. 3, the global bit lines may be connected differently than in the embodiment of FIG. 2. The present invention incorporates all ways of connecting global bit lines to select lines.

Y unit 24 may decode the addresses of the memory cells 11B and 11C and may determine which global bit lines GBL to activate and which to keep floating.

Y unit 24 may provide a double programming current $I_d$, such as $2*I_{pgm}$, to the global bit line GBL to which the two storage areas to be programmed are connected. For example, storage areas 25 and 26 share local bit line LBLa. Thus, Y unit 24 may provide double programming current $I_d$ to global bit line GBL(4) which may connect to local bit line LBLa through select transistor 14A controlled by select line SEL2. Thus, double programming current $I_d$ may arrive at both memory cells 11B and 11C.

In accordance with a preferred embodiment of the present invention, Y unit 24 may also ground both global bit lines GBL(5) and GBL(3) and X decoder 12 may also activate neighboring select lines SEL1 and SEL3 to connect select transistors 14C and 14B to local bit lines LBLc and LBLb, respectively, the external local bit lines of neighboring memory cells 11C and 11B. Accordingly, both local bit lines LBLb and LBLc may be grounded or have a close to ground signal.

In the process, both storage areas 25 and 26 may be programmed. Moreover, since both local bit lines LBLb and LBLc may be close to ground, little or no leakage current $I_{VGpipe}$ may flow to the virtual ground pipe.

It will be appreciated that, in the present invention, three global bit lines (e.g. high voltage GBL(4) and grounded GBL(3) and GBL(5)) may be activated to access two neighboring storage areas. Accordingly, the select transistors 14 may be organized such that any set of three consecutive local bit lines are connected to three different global bit lines.

Moreover, activating one set of select lines may access only one particular neighboring pair of storage areas for each access. Since each select line may be connected to multiple select transistors (both within a slice and among slices), in each slice, the multiple select transistors activated by each select line may be connected to different global bit lines, thereby to ensure that only one neighboring pair of storage areas within a slice may receive power at one time.

In the embodiment of FIG. 3, there may be 34 cells per slice of a word line and six global bit lines GBL (GBL(1) through GBL(6)) per slice. There may be 12 select lines (SEL1 through SEL12), each controlling three select transistors 14. Each of these three select transistors 14 may be connected to a different one of the six global bit lines GBL. The odd select lines may control select transistors connected to odd global bit lines and to odd local bit lines and the even select lines may control select transistors connected to even global bit lines and to even local bit lines.

Figure 4:
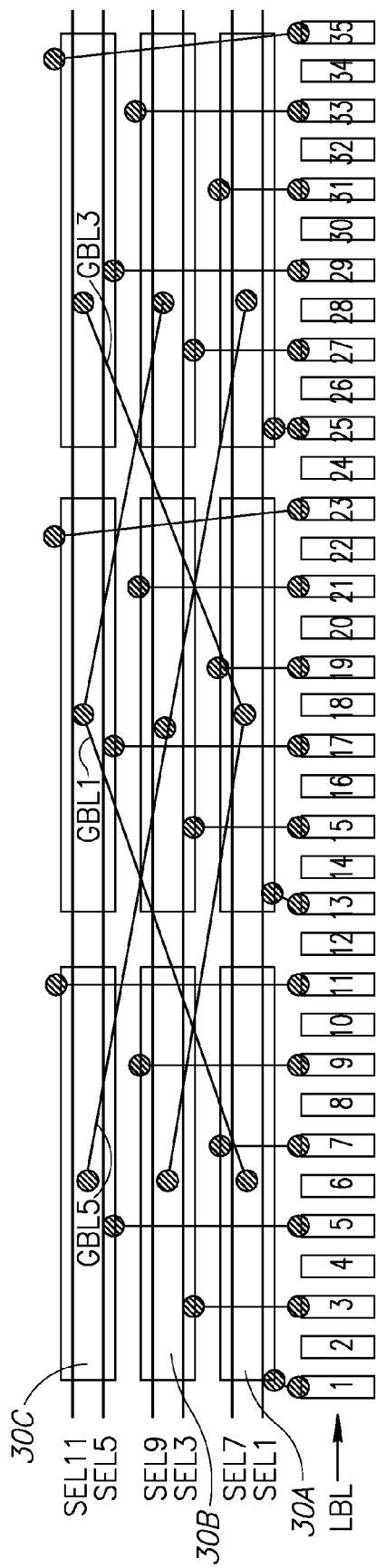
FIG. 4 is a schematic illustration of an exemplary layout of select transistors, forming part of the array of FIG. 3.

FIG. 4, to which reference is now made, illustrates one exemplary set of select transistor units, here labeled 30, which may be utilized to control a slice of 34 memory cells. Each transistor unit 30 may instantiate two select transistors 14.

In FIG. 4, nine transistor units 30 are shown, stacked in sets of three. Below transistor units 30 may be 35 local bit lines LBLj, labeled 1 to 35. Only the odd local bit lines LBLj (i.e. 1, 3, 5, etc.) may be connected to transistor units 30, there being a similar set of transistor units for the even local bit lines LBLj.

Local bit lines LBLj may be connected to transistor units 30 in groups of six odd local bit lines, each group connecting to the column of transistor units 30 above it. The first three local bit lines of each group may connect to different ones of the lower transistors of each transistor unit and the second three local bit lines may connect to different ones of the upper transistors of each transistor unit. Thus, local bit line 1 may connect to the lower transistor of transistor unit 30A, local bit line 3 may connect to the lower transistor of transistor unit 30B and local bit line 5 may connect to the lower transistor of transistor unit 30C. The next three local bit lines may connect to the upper transistors of these three transistor units, etc.

Odd select lines SEL1, SEL3, SEL5, SEL7, SEL9 and SEL11 may be the gate control lines for select transistors 14. Select lines SEL1 and SEL7 may control the bottom row of transistor units 30, select lines SEL3 and SEL9 may control the middle row of transistor units 30 and select lines SEL5 and SEL11 may control the upper row of transistor units 30. Thus, each select line may control three select transistors.

Global bit lines GBL1, GBL3 and GBL5 may each be connected to three different transistor units 30, one from each row and one from each column of transistor units 30. With this arrangement, each select transistor unit may be 12 local bit lines wide.

It will be appreciated that the present invention is operative for programming two storage areas which share the same local bit line LBLj. If, during a particular programming cycle, only one of the two storage areas needs to be programmed, the external local bit line of the cell that does not require programming may be kept floating by floating the global bit line connected to it (i.e. not driving this specific global bit line to a close to ground potential).

Figure 5:
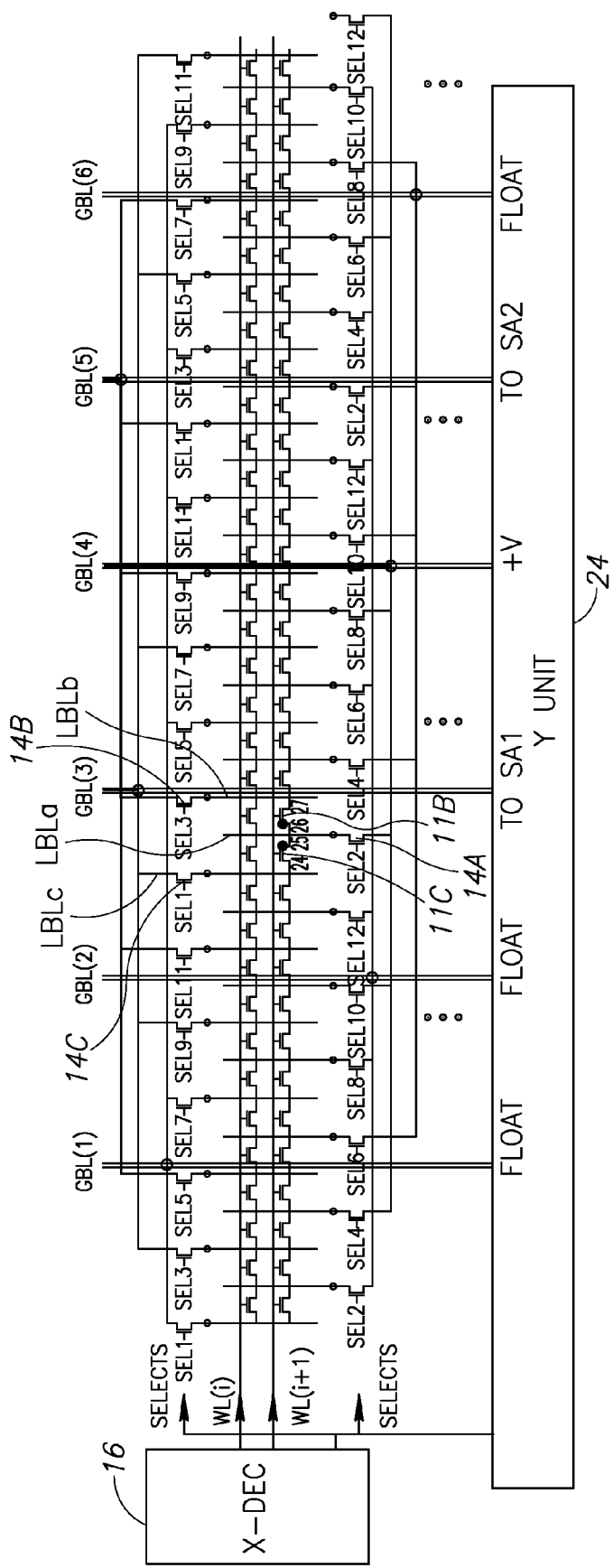
FIG. 5 is a circuit diagram illustration of an alternative virtual ground array, constructed and operative in accordance with an alternative embodiment of the present invention.

Reference is now made to FIG. 5, which illustrates a two bit reading operation using the architecture of FIG. 3. During reading, Y unit 24 may provide a reading voltage +V to the common local bit line and may connect the two external local bit lines to two different sense amplifiers (SA1 and SA2). For example, to read storage areas 24 and 27 of cells 11B and 11C from their source side in FIG. 5, the reading voltage +V may be provided to global bit line GBL(4) which, as in programming, may connect to local bit line LBLa through select transistor 14A controlled by select line SEL2. Thus, reading voltage +V may arrive at both memory cells 11B and 11C.

In accordance with a preferred embodiment of the present invention, Y unit 24 may also connect global bit line GBL(5) to sense amplifier SA2 and global bit line GBL(3) to sense amplifier SAL X decoder 16 may activate neighboring select lines SEL1 and SEL3 to connect select transistors 14C and 14B to local bit lines LBLc and LBLb, respectively. Accordingly, the states of storage areas 27 and 24 may be measured by sense amplifiers SA2 and SA1, respectively. In this process of parallel reading of two neighboring storage areas, power may be saved because, as in programming, the virtual ground pipe may not be charged, and only a single global bit line may be charged to read two storage areas at once.

Alternatively, Y unit 24 may implement prior art, single storage areas sensing schemes.

It will be appreciated that the reading and programming operations, for simultaneously operating two neighboring storage areas, are very similar. Both provide an operation voltage on an inner local bit line and both connect the two external local bit lines to a receiving unit. In the case of programming, the receiving unit is a ground or close to ground supply. For reading, the receiving unit is two sensing units.

It will further be appreciated that, in the present invention, cells 11 may be dual bit memory cells (i.e. one bit stored in each storage area) or multi-level cells (i.e. multiple bits stored in each storage area).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An NROM device comprising:
   an NROM array having NROM memory cells connected to word lines and local bit lines; and
   a reduced power operating unit to operate said cells, said unit minimizing current leaking through a virtual ground pipe by simultaneously operating two neighboring storage areas in adjacent cells sharing an internal local bit line between said adjacent cells connected to a first global bit line, wherein one of said adjacent cells connects through an external local bit line to a second global bit line and the other said adjacent cell connects through another external local bit line to a third global bit line.

2. The NROM device according to claim 1 and wherein said operating unit comprises a decoder unit to provide an operation voltage to said shared local bit line and to connect said external local bit line to a receiving unit.

3. The NROM device according to claim 2 wherein said array comprises select transistors connecting said global bit lines to said local bit lines and select lines to activate said select transistors, and wherein said decoder unit comprises:
   a Y unit to determine to which global bit line to provide said operation voltage and to which two global bit lines, neighboring said first global bit line, to connect to said receiving unit and to connect said global bit lines accordingly; and
   an X decoder to determine which select lines to activate to connect said first global bit line to said shared local bit line and said second and third global bit lines to said external local bit lines.

4. The NROM device according to claim 3 and wherein said select transistors are organized such that any set of three consecutive local bit lines are connected to three different global bit lines.

5. The NROM device according to claim 3 and wherein, during programming, said operation voltage is sufficient to provide a double programming current and said receiving unit is a close-to-ground supply.

6. The NROM device according to claim 3 and wherein, during reading, said operation voltage is a read voltage and said receiving unit is two separate sensing units.

7. The NROM device according to claim 1 and wherein said NROM memory cells are one of the following: dual-bit cells and multi-level cells.

8. A method comprising:
   minimizing current leaking through a virtual ground pipe during access of NROM memory cells by simultaneously operating two neighboring storage areas in adjacent cells sharing an internal local bit line between said adjacent cells connected to a first global bit line, wherein one of said adjacent cells connects through an external local bit line to a second global bit line and the other said adjacent cell connects through another external local bit line to a third global bit line.

9. The method according to claim 8 and wherein said operating comprises connecting an operation voltage to a shared local bit line of said two neighboring memory cells and connecting the external local bit lines of two neighboring memory cells to a receiving unit.

10. The method according to claim 9 and wherein, during programming, said operation voltage is sufficient to provide a double programming current and said receiving unit is a ground supply.

11. The method according to claim 9 and wherein, during reading, said operation voltage is a read voltage and said receiving unit is two separate sensing units.

* * * * *